United States Patent [19]

Lynch

[11] Patent Number: 4,838,800
[45] Date of Patent: Jun. 13, 1989

[54] HIGH DENSITY INTERCONNECT SYSTEM

[75] Inventor: Thomas M. Lynch, Williamsport, Pa.

[73] Assignee: GTE Products Corporation, Stamford, Conn.

[21] Appl. No.: 197,200

[22] Filed: May 23, 1988

[51] Int. Cl.4 .............................................. H01R 9/09
[52] U.S. Cl. ...................................... 439/78; 361/405
[58] Field of Search ............................. 439/55, 78-84; 174/138 G; 361/404–406

[56] References Cited

U.S. PATENT DOCUMENTS

| | | | |
|---|---|---|---|
| 3,184,532 | 5/1965 | Spera | 174/138 G |
| 3,429,041 | 2/1969 | Patton | 439/626 |
| 4,654,472 | 3/1987 | Goldfarb | 174/52 R |

OTHER PUBLICATIONS

IBM Bulletin, Joshi et al, vol. 20, No. 9, p. 3403, 2-1978.

Primary Examiner—Neil Abrams
Attorney, Agent, or Firm—William H. McNeill

[57] ABSTRACT

Plated-through-holes of printed circuit boards are segmented to provide a plurality of conductors. Matching connector pins having insulating cores and patterned conductive portions are mated with the conductors of the plated-through-holes. Each of the conductors of the holes can be connected to a different one of the patterns on the printed circuit boards thus forming a high density interconnect system.

1 Claim, 4 Drawing Sheets

HIGH DENSITY INTERCONNECT SYSTEM

TECHNICAL FIELD

This invention relates to electrical circuit boards such as printed circuit boards and particularly to such boards having increased circuit density and more particularly to a high density interconnect system.

BACKGROUND

The use of printed wiring boards in the electronics industry is well established. With the trend toward miniaturization it has become increasingly important to increase the circuit and/or component density of circuit boards. Most of the results achieved to date have involved the miniaturization of components.

DISCLOSURE OF THE INVENTION

It is, therefore, an object of this invention to obviate the disadvantages of the prior art.

It is another object of the invention to enhance printed circuit boards.

Yet another object of the invention is to provision of a printed circuit board having increased circuit density.

Yet another object is the provision of a high density interconnect system.

These objects are accomplished, in one aspect of the invention, by the provision of a high density interconnect system which comprises a first electrical circuit board having an insulating substrate with a plurality of discrete electrically conductive patterns formed thereon. At least one plated-through-hole is formed in the substrate within, and electrically connected to, one of the patterns. The plated-through-hole is segmented to provide "x" electrical conductors, "x" being greater than one. A terminal pin is positioned within the plated through-hole. The terminal pin has an electrically insulating core and "x" electrically conductive portions with each of the portions being in electrical contact with one of the conductors of the plated-through-hole PTH.

This system provides a vast increase in the number of circuit paths available in a given amount of space, thus satisfying one of the prime requisites on industry.

BEST MODE FOR CARRYING OUT THE INVENTION

For a better understanding of the present invention, together with other and further objects, advantages and capabilities thereof, reference is made to the following disclosure and appended claims taken in conjunction with the above-described drawings.

Figure 1:
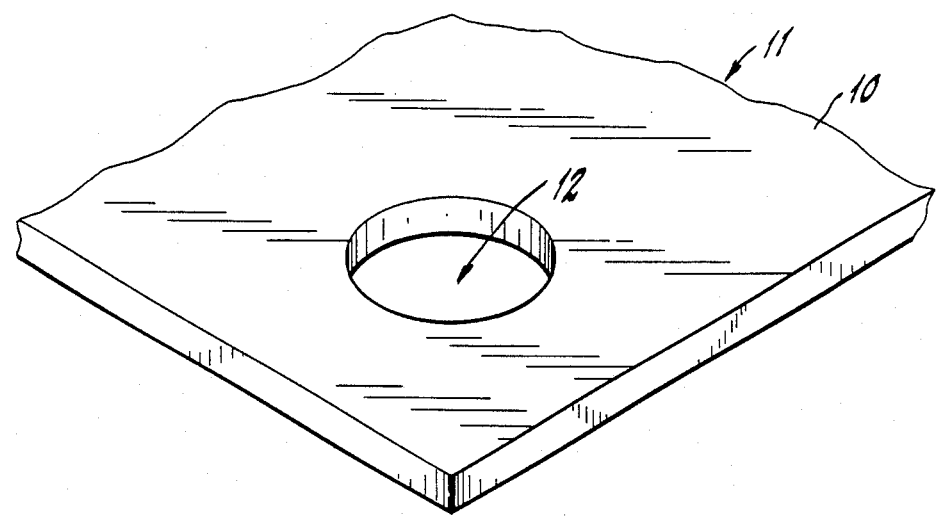
FIG. 1 is a partial, perspective view of an apertured board.
Figure 2:
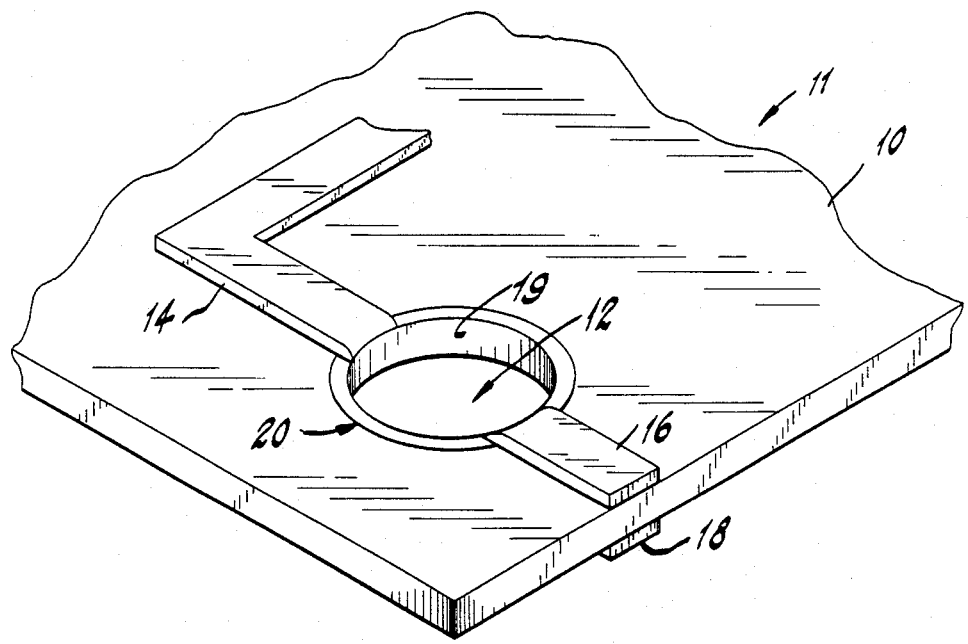
FIG. 2 is a similar view with the interior of the aperture plated to form a PTH.

Referring now to the drawings with greater particularity, there is shown in FIG. 1 the electrically insulating substrate 10 of an electrical circuit board 11. At least one aperture 12 is provided therein.

Electrically conductive patterns 14 and 16 are provided on one surface thereof and, if desired, other and different patterns 18 can be provided on the opposite surface of board 11. Aperture 12 is plated on its interior surface with an electrically conductive material 19 to form a PTH 20. The electrically conductive material 19 is in electrical contact with at least two of the electrically conductive patterns, e.g., 14 and 16. The board 11 described thus far is conventional in the art.

Figure 3:
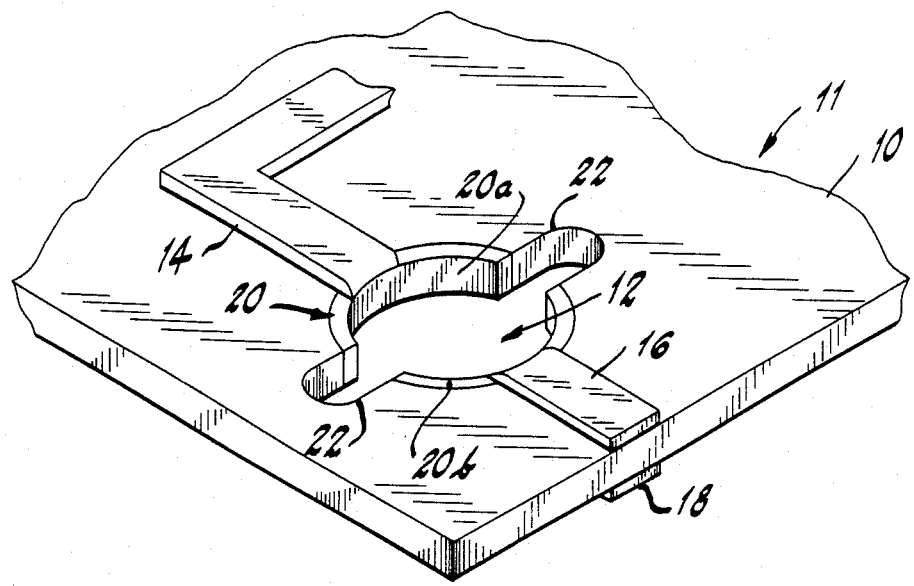
FIG. 3 is a similar view after segmentation of the PTH.

As illustrated in FIG. 3, the PTH 20 is segmented, as by slot 22, to form two discrete conductors 20a and 20b; in this instance, conductor 20a is electrically connected to pattern 14 and conductor 20b is electrically connected to pattern 16. Thus, this expedient can double the number of circuits available on a board of any given size.

Figure 4:
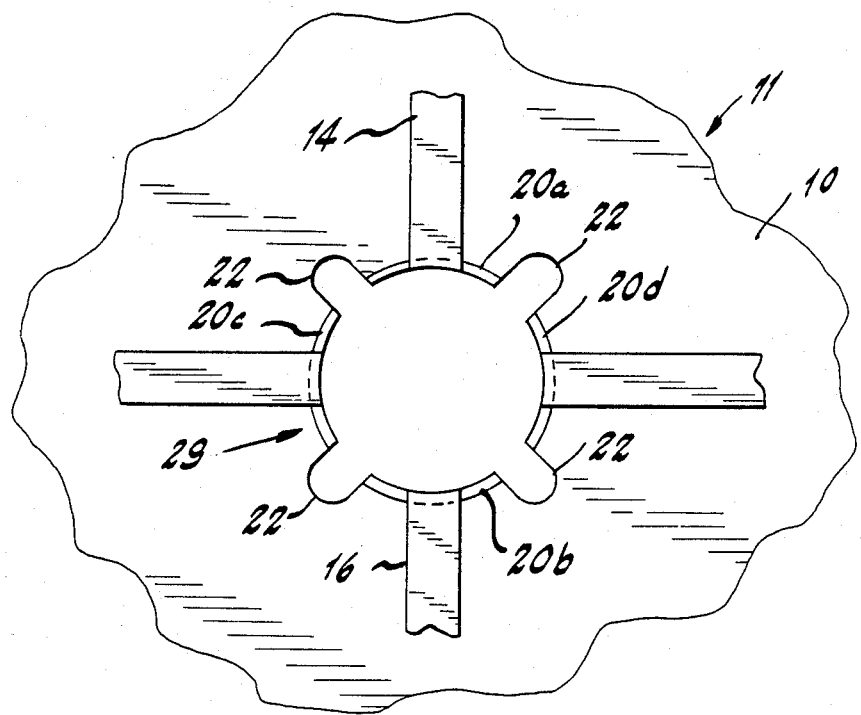
FIG. 4 is a plan view of a board with a PTH and an alternate form of segmentation.

An alternate embodiment is shown in FIG. 4 wherein a PTH 29 has been twice segmented to form four discrete conductors, 20a, b, c, d, each of which can be electrically connected to a different pattern.

Figure 5:
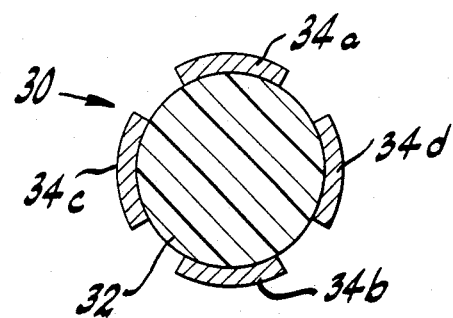
FIG. 5 is a cross-sectional plan view of a connector pin employable in the PTH of FIG. 4.

FIG. 5 illustrates a connector pin 30 which is employable with PTH 29. The pin 30 has a centrally located, electrically insulating core 32, which can be compressible to provide a friction fit within PTH 29, and four electrically conductive portions 34a, b, c, d, to mate with conductors 20a, b, c, and d.

Figure 6:
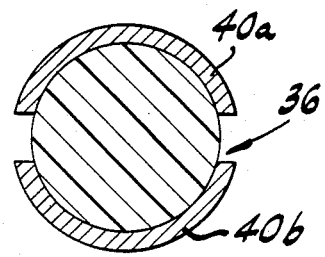
FIG. 6 is a cross-sectional plan view of a connector pin employable in the PTH of FIG. 3.

FIG. 6 illustrates a similar connector pin 36 for use with PTH 20. Pin 36 has insulating core 38 and conductive portions 40a and 40b.

Figure 7:
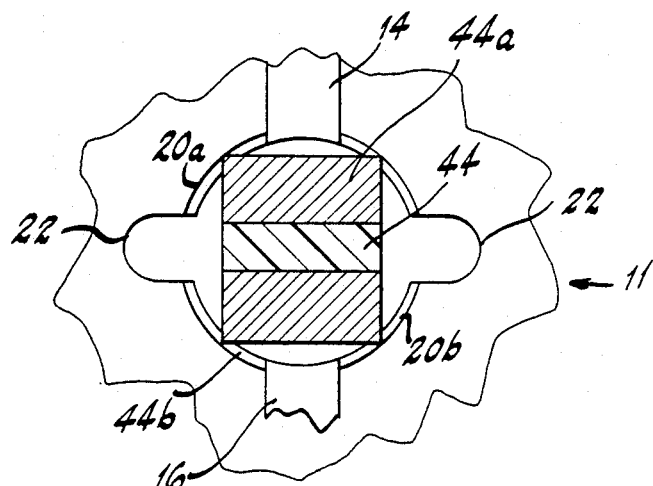
FIG. 7 is a plan view of the aperture of FIG. 3 employing an alternate form of connector pin.
Figure 8:
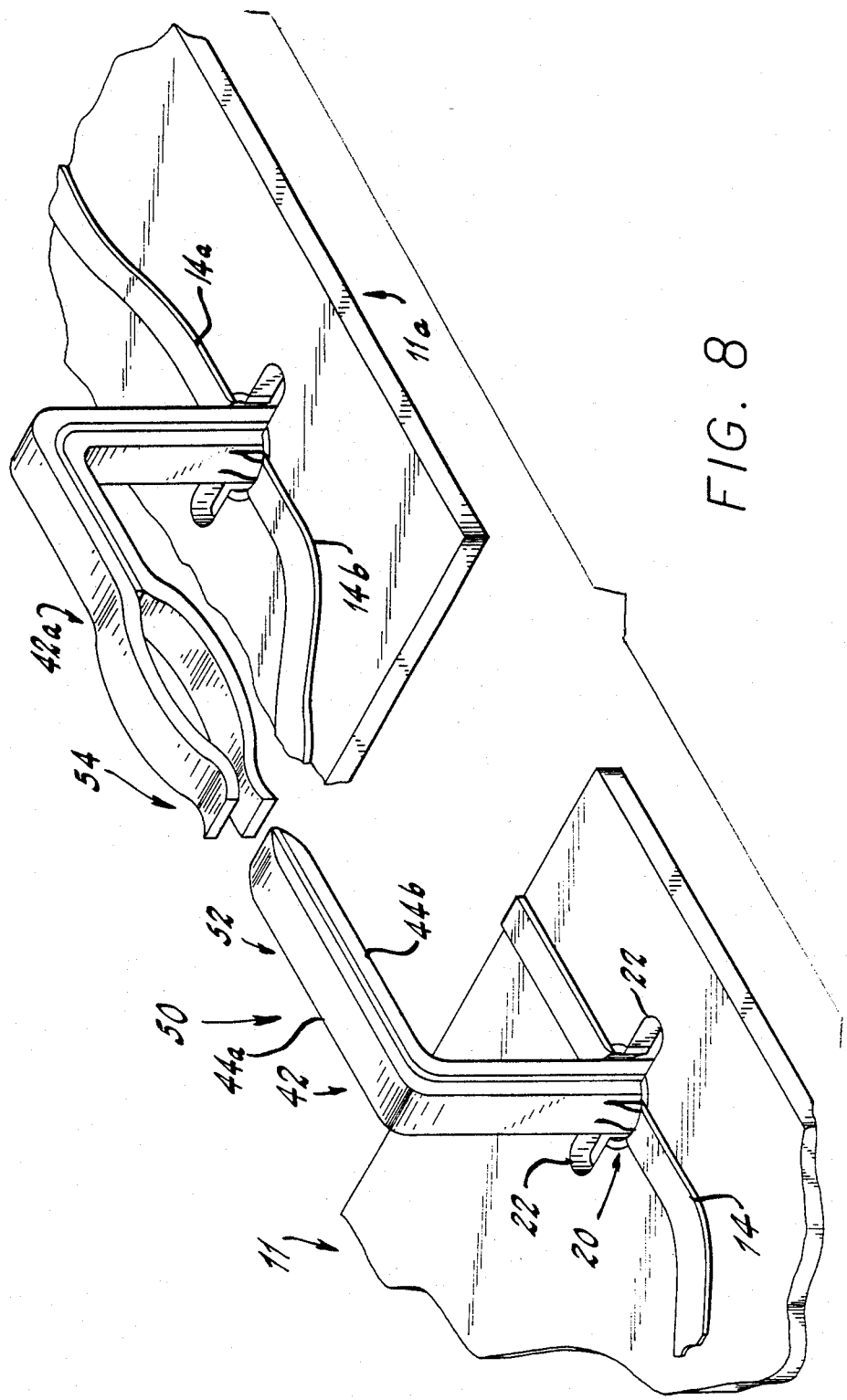
FIG. 8 is a perspective view of a high density interconnect system.

Yet another embodiment of a connector pin, 42 in this instance, is shown in sectional plan view in FIG. 7 and in perspective in FIG. 8.

Pin 42 is substantially rectangular in cross-section and has a core 44 and laminated conductive portions 44a and 44b having sharp edges which bite into the conductors 20a and 20b to provide good electrical contact.

The increased circuitry board 11 can be made by first preparing the board 11 with a plurality of electrically conductive patterns formed thereon, including at least one PTH; and subsequently segmenting the PTH to form at least two conductors. The segmenting can be done by stamping, or laser cutting or any other suitable technique.

The segmentation can also be formed before the PTH is plated, so long as the insulating areas are masked so that no plating occurs thereon.

A high density interconnect system 50 is shown in FIG. 8 as comprising a first board 11 having a segmented PTH 20 therein connecting patterns 14 and 16. A connector pin 42 is fixed within the PTH 20 and is provided with a male terminus 52.

A second board 11a also has a segmented PTH 20 therein connecting other patterns, e.g., 14a and 14b. A connector pin 42 is fixed within the PTH 20 and is provided with a female terminus 54.

Consummating the connection between pins 42 and 42a will be seen to electrically connect four separate patterns, twice as many as would be connected utilizing the prior art techniques.

By providing circuit boards 11 with PTH's 29 and pins 30, the density can be further increased.

It will be understood that duplex pins 36 and 42 and the four conductor pin 30 are exemplary only. The plated-through-holes can be segmented to provide "x" conductors and the pins can be formed to provide "x" mating conductive portions, thereby greatly increasing the design parameters available to circuit planners.

While there have been shown and described what are at present considered to be the preferred embodiments of the invention, it will be apparent to those skilled in the art that various changes and modifications can be made herein without departing from the scope of the invention as defined by the appended claims.

I claim:

1. A high density interconnect system comprising: a first electrical circuit board having an insulating substrate with a plurality of discrete electrically conductive patterns formed thereon; at least one plated-through hole formed in said substrate within, and electrically connected to, one of said electrically conducting patterns, said plated-through-hole being segmented to provide at least first and second electrical conductors; and a duplex terminal pin within said plated-through-hole, said terminal pin having an electrically insulating core and first and second electrically conductive portions, said first portion being in electrical contact with said first conductor and said second portion being in electrical contact with said second conductor, one end of said duplex terminal pin being formed as a female receptacle with said portions arranged for receiving and electrically engaging a male contact pin.

* * * * *